(12) United States Patent  
Hirano et al.

(10) Patent No.: US 8,435,842 B2  
(45) Date of Patent: May 7, 2013

(54) METHOD FOR MANUFACTURING FLEXIBLE SEMICONDUCTOR DEVICE

(75) Inventors: Koichi Hirano, Osaka (JP); Seiichi Nakatani, Osaka (JP); Tatsuo Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 220 days.

(21) Appl. No.: 12/681,399

(22) PCT Filed: Jul. 30, 2009

(86) PCT No.: PCT/JP2009/003615  
§ 371 (c)(1),  
(2), (4) Date: Jun. 22, 2010

(87) PCT Pub. No.: WO2010/016206  
PCT Pub. Date: Feb. 11, 2010

(65) Prior Publication Data  
US 2010/0261321 A1 Oct. 14, 2010

(30) Foreign Application Priority Data

Aug. 4, 2008 (JP) ................ P 2008-200768

(51) Int. Cl.  
*H01L 21/00* (2006.01)
(52) U.S. Cl.  
USPC ............ 438/158; 257/E21.414; 257/57
(58) Field of Classification Search ........... 438/158; 257/E21.414, 57, E21.616, E29.291  
See application file for complete search history.

(56) References Cited

U.S. PATENT DOCUMENTS

| | | | |
|---|---|---|---|
| 2003/0194839 A1* | 10/2003 | Chung | 438/151 |
| 2008/0111126 A1* | 5/2008 | Kim et al. | 257/40 |
| 2008/0156445 A1* | 7/2008 | Craig et al. | 156/578 |
| 2010/0012936 A1 | 1/2010 | Hirano et al. | |
| 2010/0151622 A1* | 6/2010 | Suh et al. | 438/99 |

FOREIGN PATENT DOCUMENTS

| | | |
|---|---|---|
| JP | 2003-258264 | 9/2003 |
| JP | 2005-123290 | 5/2005 |
| JP | 2005-166742 | 6/2005 |
| JP | 2005-294300 | 10/2005 |
| JP | 2006-186294 | 7/2006 |

(Continued)

OTHER PUBLICATIONS

International Search Report issued Sep. 1, 2009 in International (PCT) Application No. PCT/JP2009/003615.

(Continued)

*Primary Examiner* — Tony Tran  
(74) *Attorney, Agent, or Firm* — Wenderoth, Lind & Ponack, L.L.P.

(57) ABSTRACT

A method for manufacturing a flexible semiconductor device comprises (i) forming an insulating film on the upper surface of a resin film, (ii) forming a pattern of extraction electrodes on the upper surface of the resin film, (iii) forming a semiconductor layer on the insulating film in such a manner that the semiconductor layer is in contact with the pattern of extraction electrodes, and (iv) forming a sealing resin layer on the upper surface of the resin film in such a manner that the sealing resin layer covers the semiconductor layer and the pattern of extraction electrodes, wherein at least one of the stepsof the above steps (i) to (iv) is carried out by a printing method. With this manufacturing method, various layers can be formed by a simple printing process without using a vacuum process, photolithography, or the like.

12 Claims, 15 Drawing Sheets

FOREIGN PATENT DOCUMENTS

| | | | |
|---|---|---|---|
| JP | 2006-269475 | | 10/2006 |
| JP | 2007-67263 | | 3/2007 |
| JP | 2007-073857 | * | 3/2007 |
| JP | 2007-73857 | | 3/2007 |
| JP | 2009-503878 | | 1/2009 |
| WO | 2009/063583 | | 5/2009 |
| WO | 2009/069248 | | 6/2009 |

OTHER PUBLICATIONS

International Preliminary Report on Patentability and Written Opinion of the International Searching Authority (in English) issued Mar. 8, 2011 in International (PCT) Application No. PCT/JP2009/003615.

Machine English Translation of Japanese Patent Kokai Publication No. 2003-258264, Sep. 2003.

Machine English Translation of Japanese Patent Kokai Publication No. 2005-123290, May 2005.

Machine English Translation of Japanese Patent Kokai Publication No. 2005-166742, Jun. 2005.

Machine English Translation of Japanese Patent Kokai Publication No. 2006-269475, Oct. 2006.

Machine English Translation of Japanese Patent Kokai Publication No. 2007-73857, Mar. 2007.

Machine English Translation of Japanese Patent Kokai Publication No. 2007-67263, Mar. 2007.

Machine English Translation of Japanese Patent Kokai Publication No. 2005-294300, Oct. 2005.

Machine English Translation of Japanese Patent Kokai Publication No. 2006-186294, Jul. 2006.

Machine English Translation of Japanese Patent Kokai Publication No. 2009-503878, Jan. 2009.

* cited by examiner $$Ra = \frac{1}{L} \int_0^L |f(x)| dx$$

100, 100', 100''

100, 100', 100"

100, 100', 100'

100, 100', 100"

100, 100', 100"

METHOD FOR MANUFACTURING FLEXIBLE SEMICONDUCTOR DEVICE

CROSS-REFERENCE TO RELATED APPLICATION

The present application claims the priority under Paris Convention based on the Japan patent application No. 2008-200768 (filing date: Aug. 4, 2008, title of the invention: flexible semiconductor device and the method of manufacturing the same), the whole contents of which are incorporated herein by reference.

TECHNICAL FIELD

The present invention relates to a method for manufacturing a flexible semiconductor device. In particular, the present invention relates to a method for manufacturing a flexible semiconductor device which can be used as a TFT (thin-film transistor).

BACKGROUND OF THE INVENTION

There is a growing need for a flat-panel display as an image display device with the wide spreading use of information terminals. In addition, there are increasing opportunities, in which information, which has been conventionally provided by paper medium, is digitized with further advancement of informatization. Particularly, the needs for an electronic paper or a digital paper as a thin and light weight mobile display media, which can be easily held and carried, have recently increased (see patent document 1).

Generally, in a flat panel display device, its display medium is formed by using an element such as a liquid crystal, an organic EL (organic electroluminescence), and an electrophoresis. In such display media, a technology which uses an active drive element (TFT element) as an image drive element has become mainstream in order to secure the homogeneity of screen luminosity and screen rewriting speed and so forth. In the conventional display device, such TFT elements are formed on a glass substrate, and thereafter a liquid crystal element or an organic EL element and so forth is sealed.

As a TFT element, semiconductors including a-Si (amorphous silicon) and p-Si (polysilicon) can be mainly used. These Si semiconductors (together with metal films, as necessary) are multilayered, and each of a source electrode, a drain electrode and a gate electrode is sequentially stacked on a substrate, to thereby manufacture a TFT element. In such manufacturing of a TFT element, a manufacturing process using a vacuum system such as sputtering and so forth is usually required.

That is, in manufacturing a TFT element using those existing manufacturing facilities, it has been necessitated to form individual layers by applying a manufacturing process using a vacuum system including a vacuum chamber over and over again, so that the costs of facilities and operation have become quite expensive. For example, in manufacturing a TFT element, it is necessary to apply each process of vacuum film formation including vacuum deposition, doping, photolithography or developing over and over again to form each layer, so that an element is formed on a substrate through several tens of processes. In these manufacturing processes using conventional Si semiconductors, it is not easy to change facility designs when an extensive design change of the manufacturing device such as a vacuum chamber is required in response to the need to increase the size of a display screen.

In addition, the conventional process of manufacturing a TFT element using Si materials includes one or more steps using a high temperature, so that an additional restriction that the material of the substrate should resist a high process temperature is added. For this reason, there is no way to select a glass as the material of the substrate in practice. Thus, when a thin display device such as an electronic paper or a digital paper is constructed by using the TFT elements which were conventionally known, such a display device comes to have a heavy weight and lacks flexibility. Additionally, there is a possibility that such a display device will break due to a shock when it falls, since it is made of a glass substrate. These problems, which arose from the formation of a TFT element on a glass substrate, are not desirable when it is necessary to meet the need for a portable display that is thin and light weight with the advancement of informatization.

On the other hand, research on organic semiconductor materials as organic compounds which have high charge transporting properties have been energetically developed in recent years. These compounds are expected to be applied to an organic laser oscillating element and an organic thin film transistor element (an organic TFT element) besides an electric charge transporting material for an organic EL device.

When a device using these organic semiconductors is realized, simplification of the manufacturing process using vacuum or low pressure deposition at a relatively low temperature will be attained.

It has been considered impossible to apply a manufacturing process using low temperature to the conventional Si based semiconducting material. However, it seems to be possible that a device using an organic semiconductor can be manufactured by a manufacturing process using low temperature. Therefore, the restriction regarding the above-mentioned heat resistance of the substrate would be relieved, so that a TFT element may be formed on, for example, a transparent resin substrate. Further, if a TFT element may be formed on a transparent resin substrate and a display material may be driven by the TFT element, it is possible to manufacture a display device which has a lighter weight than the conventional display devices. In addition, it is also possible to provide a display device which has a superior flexibility and which does not break (or hardly breaks) when it falls.

PATENT DOCUMENTS

[Patent document 1] Japanese Unexamined Patent Publication (Kokai) No. 2007-67263
[Patent document 2] Japanese Unexamined Patent Publication (Kokai) No. 2005-294300
[Patent document 3] Japanese Unexamined Patent Publication (Kokai) No. 2006-186294

In order to realize an organic semiconductor device or a flexible semiconductor device as described above, attention is currently focused on printed electronics technology.

FIG. 17 schematically shows a cross-section structure of a flexible semiconductor device 1000 which contains an organic semiconductor 140, which was manufactured by using a printing process. The flexible semiconductor device 1000 shown in FIG. 17 has a structure where each layer (120, 130, 140 and 150) is stacked on a resin substrate (for example, PET, PI) 110 by a printing process. In the illustrated structure, a wiring layer 120, an insulating layer 130, an organic semiconductor layer 140, and another wiring layer 150 are formed on the upper surface of the resin substrate 110, to thereby manufacture an organic transistor.

The printing electronic technology using such a printing process provides various advantages, for example, a relief of a vacuum process (departure from a vacuum process) and an implementation of a low-temperature process (departure from a high temperature process). In addition, it is possible to carry out a process which does not perform a photolithographic process (departure from a photolithographic process) by applying a printing process. Thus, attention is focused on the printed electronics technology due to its various advantages. However, the printed electronics technology still has some problems to be overcome according to the research by the inventors as follows.

The flexible semiconductor devices using these printing technologies have been widely examined due to the possibility of its easy mass production and low cost. Particularly, a manufacturing process based on a Roll-to-Roll (RTR) process, which is capable of fast and mass production at a low cost, is expected. In the roll-to-roll process, for example, a resin substrate, which was wound into a roll, is sequentially supplied to a manufacturing device and then each layer which constitutes a TFT is printed on the resin substrate. Thereafter, a sealing film, which was wound into a roll, is laminated onto the substrate and the laminate is wound into a roll again, to thereby attain continuous production. However, it is very much a situation in which the design of how each layer of TFT is formed on the resin substrate, for example, a suitable way of forming the layers of TFT has not been sufficiently investigated.

The inventors of the present application tried to solve such problems not by following up the conventional way, but by focusing on a new way. The present invention has been accomplished in view of the above issues, and a main object of the present invention is to provide a flexible semiconductor device which is excellent in productivity.

SUMMARY OF THE INVENTION

In order to solve the above-mentioned problem, the present invention provides a method for manufacturing a flexible semiconductor device, comprising the steps of:

(i) forming an insulating film on the upper surface of a resin film, (ii) forming a pattern of extraction electrodes on the upper surface of the resin film, (iii) forming a semiconductor layer on the insulating film so that the semiconductor layer contacts with the pattern of extraction electrodes, and (iv) forming a sealing resin layer on the upper surface of the resin film so that the sealing resin layer covers the semiconductor layer and the pattern of extraction electrodes. It is preferable that all the forming steps (i) to (iv) are carried out by a printing process.

The present invention is characterized in that each of the forming steps (i) to (iv) is sequentially carried out and at least one forming step or all the forming steps of (i) to (iv) are carried out by a printing process. When viewed from the opposite side, the manufacturing method of the present invention has been accomplished by devising the relationship among the layers to be stacked so that a simple process such as a printing process can be adopted for the method or the method is suitably carried out by combining each step using a simple process. In addition, each of the steps (i) to (iv) has one or more features of the present invention.

The term "flexible" of the "flexible semiconductor device" used in the present description substantially means that the semiconductor device has a flexibility in which the semiconductor device can be inflected. The "flexible semiconductor device" in the present invention may be mentioned as a "flexible semiconductor device" or a "flexible semiconductor element", in view of the structure of the invention.

The term "printing process" in the present description means a process of forming a film (or a membrane) by any printing technology without using a vacuum process or photolithography. That is, in the present invention, the printing process means a process to form a film-like product by applying, supplying and drying its raw material in a broader sense. In a more limited sense, the specific printing process includes inkjet printing, gravure printing, screen printing, flexographic printing and offset printing.

In one preferred embodiment, after the step (iv), the lower surface of the pattern of extraction electrodes is exposed from the sealing resin layer by peeling the resin film. In this embodiment, when a plurality of flexible semiconductor devices are manufactured, a resin film, which was peeled during a manufacturing step of one flexible semiconductor device, can be reused in a subsequent manufacturing step of another flexible semiconductor device. Such reuse of the resin film may be carried out by a roll-to-roll process.

In another preferred embodiment, a source electrode and a drain electrode are formed on the lower surface of the pattern of extraction electrodes which is exposed from the sealing resin layer.

In yet another preferred embodiment, a gate electrode is formed on the sealing resin layer. That is, a gate electrode is formed above a semiconductor layer via a sealing resin. In this embodiment, the formation process of a gate electrode may comprise a step of placing a metal foil on the sealing resin layer by laminating the lower surface of the metal foil onto the upper surface of the sealing resin layer, and a step of forming the gate electrode from the metal foil by etching the metal foil. In this case, it is preferred that a metal foil having a surface roughness (Ra) of 300 nm or less at the lower surface thereof is used as the metal foil to be laminated onto the upper surface of the resin layer.

It is not limited to form a gate electrode on the sealing resin layer. For example, a gate electrode may be formed on the lower surface of the insulating film. In other word, an insulating film may be used as a gate insulating film and a gate electrode may be formed on the lower surface of the gate insulating film.

In the manufacturing method of the present invention, instead of the above steps (ii) and (iii), a step of (ii)' forming a semiconductor layer on the insulating film, and a step of (iii)' forming a pattern of extraction electrodes on the upper surface of the resin film so that the pattern of extraction electrodes contacts with the semiconductor layer may be carried out.

According to the manufacturing method of the flexible semiconductor device of the present invention, an insulating film and a pattern of extraction electrodes are formed on the upper surface of the resin film. Then, a semiconductor layer is formed on the upper surface of the insulating film so that the semiconductor layer contacts with the pattern of extraction electrodes, and a sealing resin is applied to the upper surface of the resin film so that the sealing resin covers the semiconductor layer and the pattern of extraction electrodes. Therefore, on the resin film, each layer which constitutes a TFT can be formed, for example by a simple method using the printing process and so forth.

In the case where, after the step of forming the sealing resin, the lower surface of the pattern of extraction electrodes is exposed from the sealing resin by peeling the resin film, the peeled resin film can be recovered and reused in a subsequent manufacturing process. In order to efficiently manufacture the flexible semiconductor device of the present invention with high yield, it is preferred to use a resin film having high dimensional stability. However, a resin film having such high dimensional stability is so expensive that it is technically and significantly important to recover and reuse such a resin film.

DETAILED DESCRIPTION OF THE INVENTION

Hereinafter, some embodiments of the present invention are illustrated with reference to the Figures. In the following Figures, the same reference number shows the element which has substantially the same function for simplified explanation. The dimensional relationship (length, width, thickness and so forth) in each Figure does not reflect a practical relationship thereof.

Each "direction" referred to in the present description means the direction based on the spacial relationship between the resin film 60 and the semiconductor layer 20, in which each of upward direction and downward direction is mentioned relating to the direction in the figures for convenience. Specifically, each of upward direction and downward direction corresponds to the upward direction and downward direction in each figure. The side on which the semiconductor layer 20 is formed based on the resin film 60 is referred to as "upward direction" and the side on which the semiconductor layer 20 is not formed based on the resin film 60 is referred to as "downward direction."

Flexible Semiconductor Device Obtained from the Manufacturing Method of the Present Invention At first, the flexible semiconductor device 100, which is obtained from the manufacturing method of the present invention, is briefly explained with reference to FIGS. 1A and 1B. Each of FIGS. 1A and 1B schematically shows a sectional view of the flexible semiconductor device 100, which is obtained from the manufacturing method of the present invention.

Figure 1A:
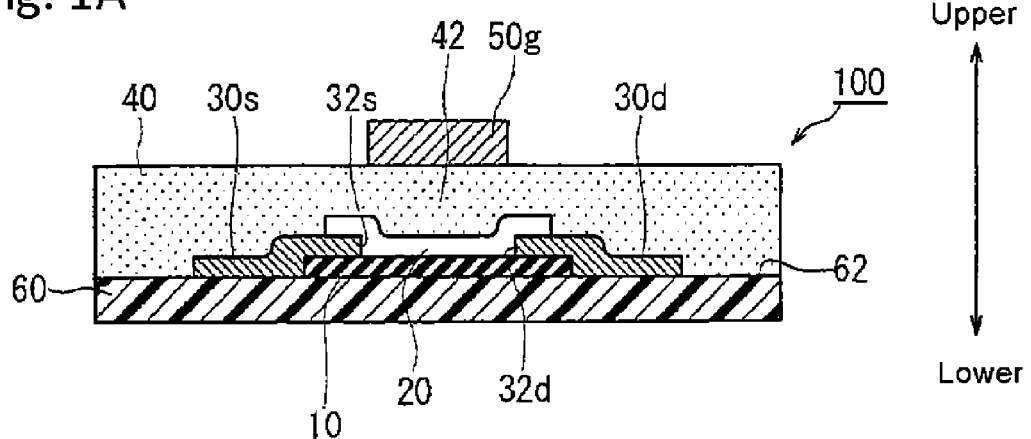
FIGS. 1A and 1B show a sectional view of a flexible semiconductor device, which is obtained by the manufacturing method of the present invention.
Figure 1B:
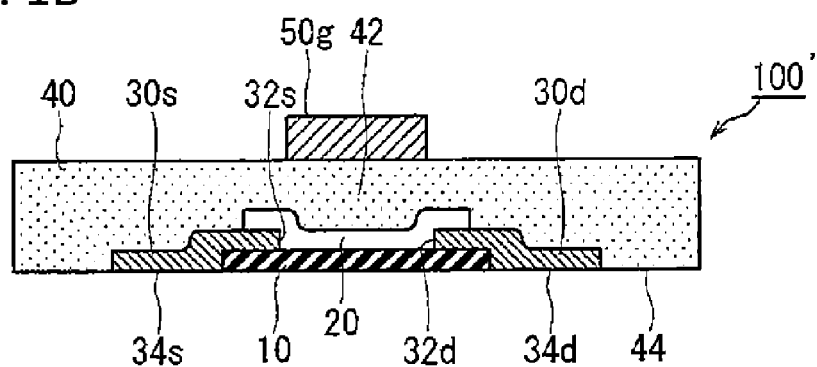

As shown in FIG. 1A, in the flexible semiconductor device 100 obtained from the manufacturing method of the present invention, a TFT (thin-film transistor) is constituted by stacking various layers on the resin film 60. That is, the flexible semiconductor device 100 comprises a semiconductor layer 20 which constitutes a TFT, an insulating film (protection layer) 10, a source extraction electrode 30s, a drain extraction electrode 30d and a gate electrode 50g. These various elements are stacked on the resin film 60, and the insulating film, the semiconductor layer and the extraction electrodes (10, 20, 30s, 30d) are sealed by the sealing resin layer 40.

More specifically, in the flexible semiconductor device 100 shown in FIG. 1A, the insulating film 10 and the source extraction electrode 30s and the drain extraction electrode 30d are formed on the upper surface 62 of the resin film 60 and the semiconductor layer 20 is formed over the insulating film 10 so that the semiconductor layer 20 contacts with each of the source/drain extraction electrodes 30s and 30d. Additionally, the sealing resin layer 40 is formed to seal up the semiconductor layer 20 and the source/drain extraction electrodes 30s and 30d, and then the gate electrode 50g is formed above the semiconductor layer 20 via the sealing resin layer 40.

Each of the component elements is explained in sequence. The resin film 60 serves as a substrate, which supports each layer (10, 20, 30s, 30d) that constitutes a TFT during the manufacturing process. There is no particular restriction on the material of the resin film 60 unless it has an influence on the flexible properties and the like thereof. For example, a polyimide resin may be mentioned as an example of the resin film 60.

The insulating film 10 formed on the upper surface 62 of the resin film 60 functions as a protection layer, which protects the semiconductor layer 20. As the material for such an insulating film 10, a film based on an inorganic insulator or based on a resin having an insulating property is used. An example of the film based on a resin includes a polyphenylene ether resin film.

The semiconductor layer 20 is formed above the upper surface of the insulating film 10. As shown in a Figure (see FIG. 1A), the semiconductor layer 20 is partially formed (at the center in FIG. 1A) above the upper surface of the insulating film 10, so that the semiconductor layer covers each of the extended parts 32s and 32d of the extraction electrodes 30s and 30d. As the semiconductor layer 20, an organic semiconductor layer which comprises, for example, pentacene can be mentioned.

Each of the extraction electrodes 30s and 30d is formed on the upper surface 62 of the resin film 60 and contacts with the semiconductor layer 20. That is, each of a part 32s of the extraction electrode 30s and a part 32d of the extraction electrode 30d extends over the upper surface of the insulating film 10 and contacts with the semiconductor layer 20. It is possible to actuate the flexible semiconductor device 100, even if these extended parts 32s and 32d are absent. However, it becomes possible to shorten the channel length (herein, the distance between the extraction electrode 30s and the extraction electrode 30d) by forming the extended parts 32s and 32d. As a result, it is possible to attain an improvement of the performance speed of the device due to shortening of the channel length. Meanwhile, the material of the extraction electrodes 30s and 30d may include various suitable materials such as a metallic material and a conductive oxide.

The sealing resin layer 40 is formed so that the sealing resin layer covers the semiconductor layer 20, the insulating film 10, and the extraction electrodes 30s and 30d, and has a flexibility so that it can "seal" the underneath layers as the name suggests. As the material for the sealing resin layer 40, a resin material having flexibility after being cured is preferable. An example of such a resin material includes polyphenylene ether resin.

The gate electrode 50g is formed above the semiconductor layer 20 via the sealing resin layer 40. That is, the gate electrode 50g is arranged so that it opposes the semiconductor layer 20 across the sealing resin layer 40. In such arrangement, the part sandwiched between the semiconductor layer 20 and the gate electrode 50g in the sealing resin layer 40 functions as a gate insulating film 42. The material of the gate electrode 50g may be a metal material having a good conductivity.

According to the manufacturing method of the present invention, a flexible semiconductor device 100' as shown in FIG. 1B may also be obtained. The flexible semiconductor device 100' shown in FIG. 1B corresponds to a device in a condition which resulted from removing the resin film 60 from the flexible semiconductor device 100 shown in FIG. 1A. Specifically, the device shown in FIG. 1B is a result of peeling the resin film 60 from the sealing resin layer 40 in the flexible semiconductor device 100 shown in FIG. 1A. Thus, it becomes possible to transfer each layer of TFT formed on the resin film 60 to the sealing resin layer 40 by peeling the resin film 60 therefrom, and each of the lower surfaces 34s and 34d of the extraction electrodes 30s and 30d can be exposed from the sealing resin layer 40. A wiring layer may be formed on the lower surface 44 of the sealing resin layer 40. In such case, a source electrode 50s and a drain electrode 50d may be formed on the lower surfaces 34s and 34d of the extraction electrodes 30s and 30d which were exposed from the sealing resin layer 40 (see FIG. 5).

A Manufacturing Method of the Present Invention

Next, the manufacturing method of the flexible semiconductor device 100 according to the present invention is explained with reference to FIGS. 2A-C and FIGS. 3A-C.

Embodiment 1

Figure 2A:
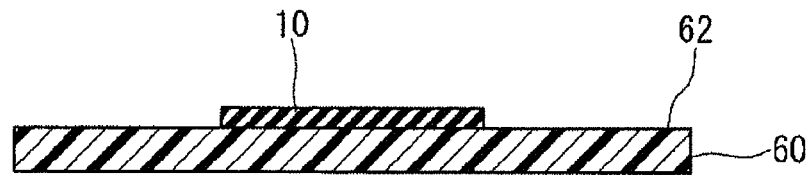
FIGS. 2A to 2C show a process sectional view (in Embodiment 1), which schematically shows each of manufacturing steps of the flexible semiconductor device of the present invention.

In the manufacturing method of the present invention, the step (i) is carried out first. That is, as shown in FIG. 2A, an insulating film 10 is formed on the upper surface 62 of the resin film 60. The resin film 60 used in the present embodiment functions as a substrate which supports the insulating film 10 and the semiconductor layer during the manufacturing process, as described above. The resin film 60 has a thickness in a range preferably from about 10 micrometers to about 100 micrometers, more preferably from about 20 micrometers to about 50 micrometers, and as a specific example a thickness of 38 micrometers. The material of the resin film 60 may include polyimide (PI) resin, polyethylene terephthalate (PET) resin, polyethylenenaphthalate (PEN) resin, polyphenylene sulfide (PPS) resin, polyphenylene ether (PPE) resin, aramid resin, and a liquid crystal polymer and so forth. As a particularly preferable resin material, polyimide (PI) resin may be mentioned. This is because polyimide (PI) resin is excellent in the properties of heat resistance and dimensional stability, so that it is preferable as the material which constitutes the substrate material of TFT.

The insulating film 10 formed on the resin film 60 is an insulating film based on a resin or an inorganic insulator. As the insulating film 10 based on a resin, a film which is formed of an epoxy resin, polyimide (PI) resin, polyphenylene ether (PPE) resin, polyphenylene oxide resin (PPO), polyvinyl pyrrolidone (PVP) resin and so forth may be mentioned. As the insulating film 10 based on a particularly preferred resin, the insulating film which comprises polyphenylene ether (PPE) resin can be mentioned. This is because polyphenylene ether (PPE) resin is preferred especially as the material which protects the semiconductor layer 20, since it has high strength and is excellent in heat resistance and insulation. On the other hand, as the insulating film 10 based on an inorganic insulator, metal oxides, for example, tantalic oxide (e.g. $Ta_2O_5$), aluminum oxide ($Al_2O_3$), silicon oxide ($SiO_2$), zeolite oxide ($ZrO_2$), titanium oxide ($TiO_2$), yttrium oxide ($Y_2O_3$), lanthanum oxide ($La_2O_3$), and hafnium oxide ($HfO_2$) or nitride of those metals and so forth may be mentioned. A film which comprises dielectric materials, such as barium titanate ($BaTiO_3$), strontium titanate ($SrTiO_3$), or calcium titanate ($CaTiO_3$) may be used.

The insulating film 10 may be formed on the resin film 60 by a printing method/printing process. Especially in formation of an insulating film based on a resin, an insulating film 10 can be formed by applying a coating agent (which may be the resist containing a sensitization agent and which is obtained by mixing a resin material with a medium) to the formation position on the upper surface 62 of the resin film 60, drying and heat-treating to harden the coating agent. For example, the insulating film 10 comprising polyphenylene ether (PPE) resin can be formed by applying unhardened polyphenylene ether (PPE) resin to the formation position (for example, by gravure printing), and hardening it. In the case of an insulating film based on an inorganic insulator, the insulating film 10 may be formed by the thin film deposition method (for example, sputtering method) which uses a mask. The insulating film 10 based on a resin or an inorganic insulator being formed has a thickness of preferably from about 0.1 micrometer to about 2 micrometers, more preferably from about 0.2 micrometer to about 1 micrometer, and as a specific example, about 0.3 micrometer.

Figure 2B:
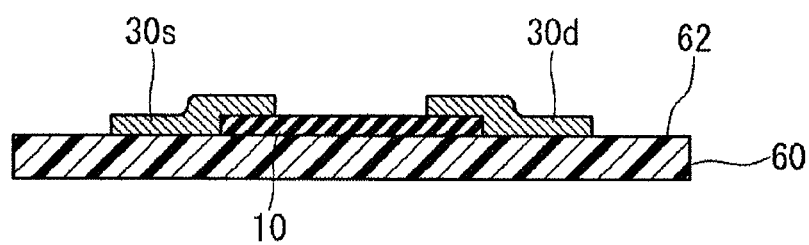

The step (i) is followed by the step (ii). That is, as shown in FIG. 2B, a pattern of the source extraction electrode 30s and a pattern of the drain extraction electrode 30d are formed on the upper surface 62 of the resin film 60.

The material of the extraction electrodes 30s and 30d includes, for example, a metal material such as gold (Au), silver (Ag), copper (Cu), nickel (Ni), chromium (Cr), cobalt (Co), magnesium (Mg), calcium (Ca), platinum (Pt), molybdenum (Mo), iron (Fe), zinc (Zn), titanium (Ti) and tungsten (W), or a conductive oxides such as tin oxide ($SnO_2$), indium tin oxide (ITO), fluorine doped tin oxide (FTO), ruthenium oxide ($RuO_2$), iridium oxide ($IrO_2$) and platinum oxide ($PtO_2$) and so forth.

The pattern of extraction electrodes 30s and 30d may be formed by a printing method/printing process, which is similar to the formation of the insulating film 10. For example, a pattern of the source extraction electrode 30s and a pattern of the drain extraction electrode 30d may be formed on the upper surface 62 of the resin film 60 by a printing method such as an ink jet process. The pattern of the source/drain extraction electrodes 30s and 30d are preferably stacked on the upper surface 62 of the resin film 60, so that the pattern of extraction electrodes may partially overlap the insulating film 10 as shown in FIG. 2B. That is, it is preferable to form the pattern of the source/drain extraction electrodes 30s and 30d over the resin film 60, so that any part of the pattern of extraction electrodes extends to the upper surface of the resin film 60. Additionally, the pattern of the source/drain extraction electrodes 30s and 30d may be formed by the other methods including a vacuum deposition process and a sputtering process. For example, $RuO_2$ layer may be formed by using a vacuum deposition method.

The pattern of the source/drain extraction electrodes 30s and 30d being formed on the upper surface 62 of the resin film 60 has a thickness of preferably from about 50 nm to about 150 nm, more preferably from about 80 nm to about 120 nm, for example, about 100 nm.

Figure 2C:
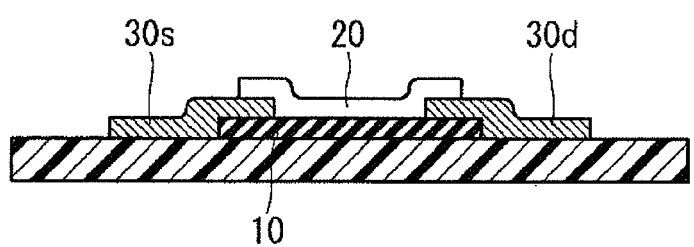

The step (ii) is followed by the step (iii). That is, as shown in FIG. 2C, the semiconductor layer 20 is formed over the insulating film 10. The semiconductor layer 20 may be formed so that the semiconductor layer 20 contacts with the pattern of the source/drain extraction electrodes 30s and 30d.

The semiconductor layer 20 to be formed is made of, for example, an organic semiconductor. As a material of the organic semiconductor, the material having a high mobility, for example, pentacene is preferable. Not being limited thereto, the material of the organic semiconductor which may be used for the present invention includes, in addition to a polymer material (for example, polythiophene or its derivative) and a low molecular material (for example, pentacene and solubilized pentacene), a nanocarbon material (for example, a carbon nanotube, SiGe nanowire, fullerene, modified fullerene), an inorganic/organic composite material (for example, a composite system of ($C_6H_5C_2H_4NH_3$) and $SnI_4$) and so forth.

The method of forming the semiconductor layer 20 is not particularly limited, and any method may be adopted if such a method can form a semiconductor layer on an insulating film so that the semiconductor layer contacts with a pattern of extraction electrodes. Particularly according to the manufacturing method of the present invention, the semiconductor layer 20 can be formed by a printing method/printing process. For example, in the case where a polymer organic semiconductor layer (for example, poly thiophene or its derivatives, such as poly-3-hexyl-thiophene (P3HT)) is formed, a printing process can be suitably used. More specifically, a P3HT solution is sprayed onto the insulating film by an ink jet printing process, followed by being dried to obtain a semiconductor layer 20. In the case of a low molecular organic semiconductor (for example, pentacene), the organic semiconductor layer 20 may be formed by a vapor deposition process.

It is preferable that the semiconductor layer 20 is formed on the insulating film 10 without sticking out from the upper surface of insulating film 10. In the case where a sealing resin layer 40 is used as an element of the TFT, there is a possibility that the semiconductor layer 20 may be deteriorated by the presence of steam and oxygen included in the sealing resin layer 40. Therefore, the insulating film 10 can suitably function as a protection layer which protects the semiconductor layer 20 by forming the semiconductor layer 20, without sticking out from the upper surface of insulating film 10. The formed semiconductor layer 20 has a thickness of preferably from about 50 nm to about 150 nm, more preferably from about 80 nm to about 120 nm, and as a specific example, about 100 nm.

Figure 3A:
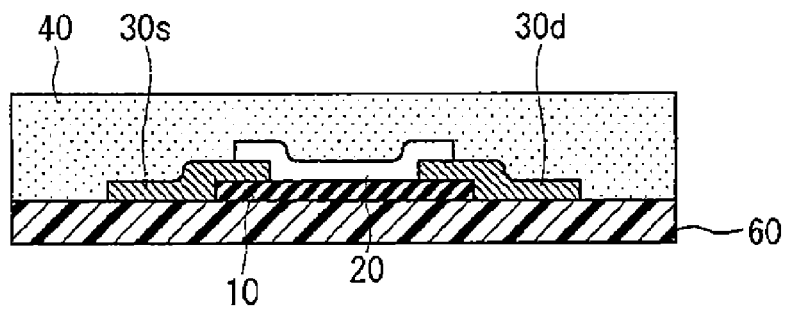
FIGS. 3A to 3D show a process sectional view (in Embodiment 1), which schematically shows each step of manufacturing the flexible semiconductor device of the present invention.

The step (iii) is followed by the step (iv). That is, as shown in FIG. 3A, the sealing resin layer 40 is formed on the upper surface of the resin film 60, so that the sealing resin layer 40 covers the semiconductor layer 20 and the extraction electrodes 30s and 30d.

As the resin material of the sealing resin layer 40, the material having a flexibility after being hardened is preferable. Such a resin material includes, for example, an epoxy resin, a polyimide (PI) resin, an acrylic resin, a polyethylene terephthalate (PET) resin, a polyethylenenaphthalate (PEN) resin, a polyphenylene sulfide (PPS) resin, a polyphenylene ether (PPE) resin, or a composition thereof. Any of those resin materials is preferable for the manufacturing method of the present invention, since it is excellent in dimensional stability.

The method of forming the sealing resin layer 40 is not particularly limited, and any method may be adopted if such a method can form a sealing resin layer on the upper surface of the resin film, so that the sealing resin layer covers the semiconductor layer and the pattern of extraction electrodes. Especially speaking of the present invention, the sealing resin layer may be formed by a printing method/printing process. For example, the sealing resin layer 40 can be formed by applying an unhardened resin material in a liquid form (for example, a coating agent which was made by mixing a resin material with a liquid medium) on the upper surface of the resin film 60 by spin coating followed by drying. As a result, the semiconductor layer 20 can be suitably sealed.

The sealing resin layer 40 can be formed by a process wherein an unhardened resin, which was preliminarily shaped into a film form, is stacked on the upper surface 62 of the resin film 60, and is hardened. A process, wherein an adhesive material is applied onto the upper surface of the resin, which was preliminarily shaped into a film form, and then the side to which the adhesive material is stacked is laminated onto the upper surface of the resin film 60, may be adopted. As a method of laminating the sealing resin layer 40 and the resin film 60, any method using, for example, a roll lamination, a vacuum lamination or a press by pressurizing may be suitably adopted. After such laminating step, the semiconductor layer 20 and the extraction electrodes 30s and 30d will be embedded under the lower surface of the sealing resin layer 40, so that the semiconductor layer 20 can be sealed by the sealing resin layer 40. For example, to cite a case, polyphenylene ether (PPE) resin, which is unhardened and shaped into a film form, may be stacked on the upper surface of the resin film 60.

The sealing resin layer 40, which is obtained from the step (iv), has a thickness of preferably from about 1 micrometer to about 7 micrometers, more preferably from about 2 micrometers to about 5 micrometers, and as a specific example, about 4 micrometers. Since the sealing resin layer 40 functions as a gate insulating film, it is preferable that the thickness of the sealing resin layer 40 is thin. In this regard, the thickness of 5 micrometers or less is suitable. However, the thickness may be suitably adjusted depending on the required TFT properties.

As described above, in the manufacturing method of the present invention, steps (i) to (iv) are sequentially carried out, such that the insulating film 10 and the pattern of extraction electrodes 30s and 30d are formed on the upper surface 62 of the resin film 60. Thereafter, the semiconductor layer 20 is formed on the insulating film 10 so that the semiconductor layer contacts with the pattern of extraction electrodes 30s and 30d and then the sealing resin layer 40 is formed on the upper surface 62 of the resin film 60, so that the sealing resin layer 40 covers the semiconductor layer 20 and the pattern of extraction electrodes 30s and 30d. Therefore, in the manufacturing method of the present invention, it can be said that, each layer which constitutes the TFT can be formed on the resin film 60 by, for example, a simple process using the printing process and so forth. The fact that each layer can be formed by the printing process means that each layer can be formed at a normal pressure and/or relatively low temperature (for example, the maximum process temperature being about 100° C.) using the liquid process and the like, so that it is desirable not only in the efficiency of the manufacturing process, but also in the efficiency of utilization of the raw material since the liquid can be locally applied to the necessary portions. Speaking of the utilization efficiency of the raw material, the present method enables a decrease in the amount of raw material used, compared with the method of "forming each constituent parts of TFT by deposition through a vacuum device, followed by removing unnecessary film portions by a lithography or an etching", which method was conventionally adopted.

After the steps (i) to (iv) were carried out, the gate electrode 50g may be formed. The gate electrode 50g may be formed by using a printing process such as an ink jet process. Without being limited thereto, the gate electrode 50g may be, for example, formed by etching a metal foil.

Figure 3B:
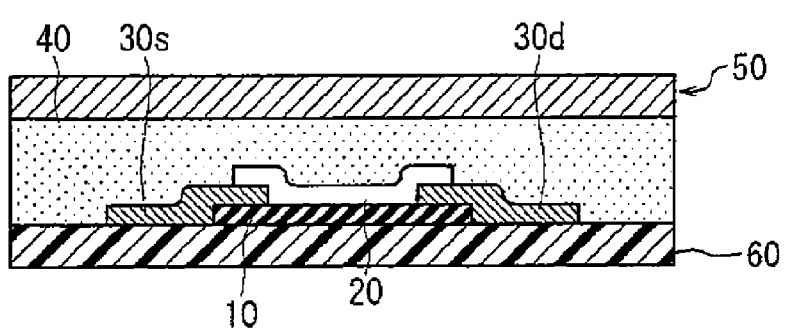

In forming the gate electrode 50g from a metal foil, at first, a metal foil layer 50 is formed on the sealing resin layer 40 as shown in FIG. 3B. That is, the metal foil 50 is disposed on the sealing resin layer 40 by stacking the lower surface of the metal foil 50 onto the upper surface of the sealing resin layer 40. The material of the metal foil 50 includes, for example, copper (Cu), nickel (Ni), aluminum (Al), stainless steel (SUS), and is particularly preferable to be a metal material having an improved electrical conductivity. The metal foil has a thickness of preferably from about 4 micrometers to about 25 micrometers, more preferably from about 8 micrometers to about 16 micrometers, and as a specific example, about 12 micrometers.

Figure 4:
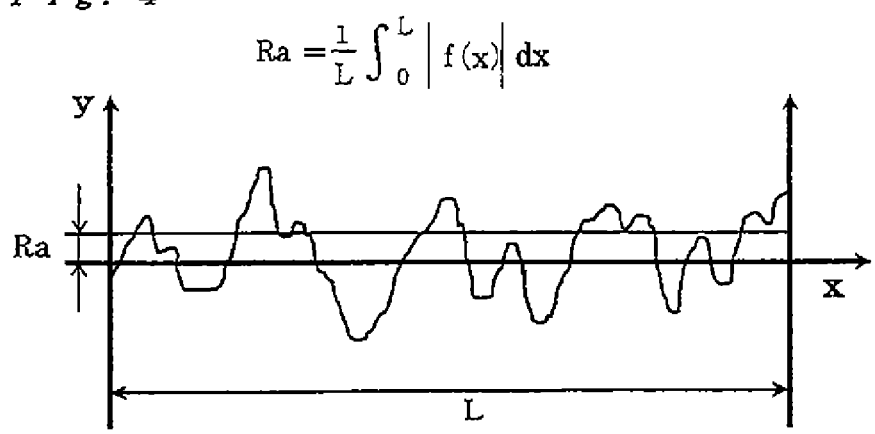
FIG. 4 schematically shows a concept of arithmetic mean roughness (Ra).

It is preferable to use a metal foil having a surface roughness (Ra) of 300 nm (nanometer) or less at the lower surface thereof as the metal foil to be laminated onto the upper surface of the resin layer. In other words, the metal foil 50 has a surface roughness (in an arithmetic mean roughness Ra) of 300 nm or less, that is, the metal foil 50 preferably has a surface roughness in a range from 0 to 300 nm (except for 0), more preferably has a surface roughness in a range from 10 to 300 nm. As used in this description and claims, the phrase "arithmetic mean roughness (Ra)" substantially means an average value, which is obtained by summing the absolute values of deviations from a mean line to a measurement curve at an extracted portion, which corresponds to a portion having a reference length L, which is extracted from a roughness curve as shown in FIG. 4 (the roughness curve being the "cross-sectional profile at the lower surface of the metal foil 50" as for the present invention) in the direction of the mean line. When a metal foil 50 having an excellent surface smoothness is used, formation of uneven sealing resin layer 40 (in particular, a section which functions as a gate insulating film) due to the section having an uneven thickness of the metal foil 50 could be prevented. That is, the distance between the metal foil and the semiconductor layer can be maintained constant. Additionally, a failure that (a part of) the metal foil penetrates into the sealing resin layer 40 due to the uneven thickness of the metal foil 50 may be avoided. That is, it becomes possible to stably manufacture the flexible semiconductor device 100 in terms of results. As the metal foil 50 having such an excellent surface smoothness, for example, a rolled copper foil can be preferably used.

Figure 3C:
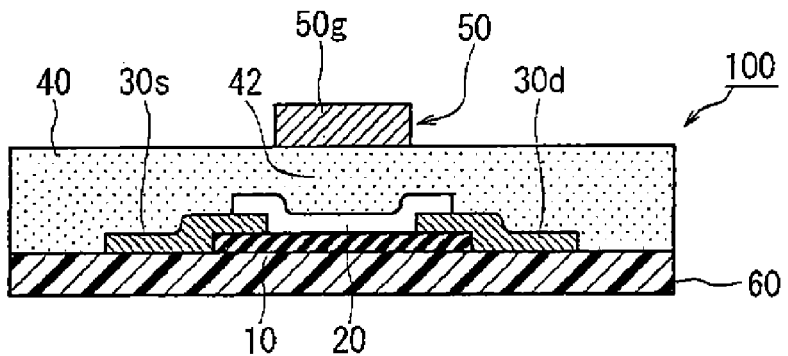

After disposing the metal foil 50 on the sealing resin layer 40, the gate electrode 50g can be formed by etching the metal foil 50 (refer to FIG. 3C). The etching process is not particularly limited, but may use a conventionally known method, typically an etching process using the photolithographic approach.

By going through such a process, the flexible semiconductor device 100 in which each of the semiconductor layer 20, the insulating film 10, the extraction electrodes 30s and 30d, sealing resin layer 40 and the gate electrode 50g has been formed on the resin film 60 can be eventually obtained.

Figure 3D:
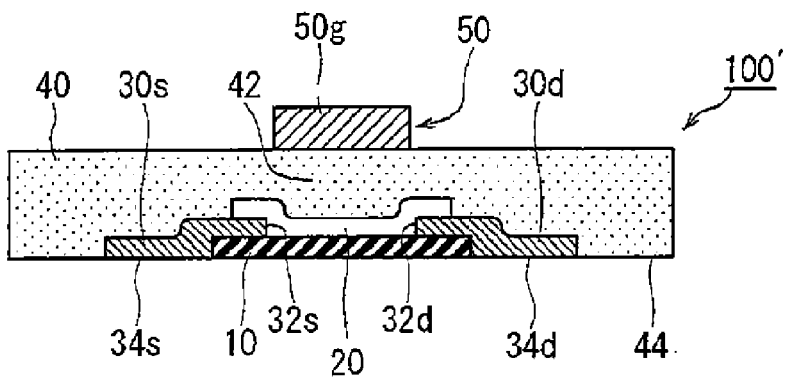

In the manufacturing method of the present invention, as a further step, the resin film 60 may be peeled from the sealing resin layer 40 as shown in FIG. 3D. When the resin film 60 is peeled, each layer of TFT formed on the resin film 60 can be transferred to the sealing resin layer 40. In addition, each of the lower surfaces 34s and 34d of the pattern of extraction electrodes 30s and 30d can be exposed from the sealing resin layer 40.

Referring to the term "transfer", a plurality of TFTs comprising each layer (10, 20, 30s, 30d) on the resin film as shown in FIG. 2C can be typically manufactured according to the manufacturing method of the present invention. In this case, a part of a plurality of TFTs can be transferred. Thus, inspection and evaluation are carried out on each of a plurality of TFTs before performing the step of laminating the sealing resin layer 40, and the products which have been evaluated as good can be partially and selectively stacked onto the sealing resin layer 40. Accordingly, it is possible to prevent occurrence of failure on the end products during the manufacturing method thereof, such that waste of materials in the following steps can be avoided.

Referring to the condition where "the pattern of extraction electrode is exposed", in the flexible semiconductor device 100' after the resin film 60 has been peeled, each of the lower surfaces 34s and 34d of the pattern of extraction electrodes 30s and 30d is located coplanar with each of the lower surfaces of the sealing resin layer 40 and the insulating film 10 as shown in FIG. 3D. Therefore, each of the source electrode 50s and the drain electrode 50d can be suitably formed on each of the lower surfaces 34s and 34d of the pattern of extraction electrodes 30s and 30d, which are exposed from the sealing resin layer 40 (see FIG. 5). As the materials for the source electrode 50s and the drain electrode 50d, a metal having a good conductivity is preferable, for example, copper (Cu), nickel (Ni), aluminum (Al) or stainless steel (SUS) can be used. It is possible to utilize a printing process such as an ink jet process for forming the source electrode 50s and the drain electrode 50d. Alternatively, another process, for example, a vacuum deposition process or a sputtering process may be adopted.

As a method for peeling the resin film 60, a mechanical peeling method accompanied by stress may be applicable. Such a method may be a peeling method, which uses a physical or chemical function to reduce the adhesion between the resin film 60 and the sealing resin layer 40. For example, it may be a method to interpose a thermo-foaming film, which can be removed by heating, between the resin film 60 and the sealing resin layer 40. The resin film 60 which has been thus peeled can be recovered and can be reused in the following manufacturing method of the flexible semiconductor device. In order to effectively carry out the present manufacturing method of the flexible semiconductor device 100 with good yield, it is preferable to use a resin film 60 which has a high dimensional stability. However, since the resin film 60 having a high dimensional stability is so expensive, there is a significant technical importance in recovering and reusing the resin film.

The embodiment, which recovers and reuses the resin film, is preferably carried out by, for example, a roll-to-roll process. That is, in the roll-to-roll process (RTR) which can form a plurality of flexible semiconductor devices, a resin film peeled off in a manufacturing method of a certain flexible semiconductor device may be reused in a following manufacturing method of another flexible semiconductor device.

Hereinafter, an embodiment which carries out the present invention by a roll-to-roll process is explained. The manufacturing method of the present invention is easily applicable to the roll-to-roll process, since each layer (10, 20, 30s, 30d) which constitutes TFT can be formed on the upper surface 62 of the resin film 60 by a simple process such as a printing process. For example, each layer (10, 20, 30s, 30d) of TFT is formed on the upper surface 62 of the resin film 60, while sequentially supplying the resin film 60 which had been wound into a roll to the manufacturing device. Then, a process is carried out, wherein after laminating the sealing resin layer 40 which is supplied from the roll that was wound into a roll, the laminate is wound into a roll again. An inexpensive, mass production and high-speed manufacturing process can be realized by carrying out the present invention which adopts the roll-to-roll process.

Figure 6:
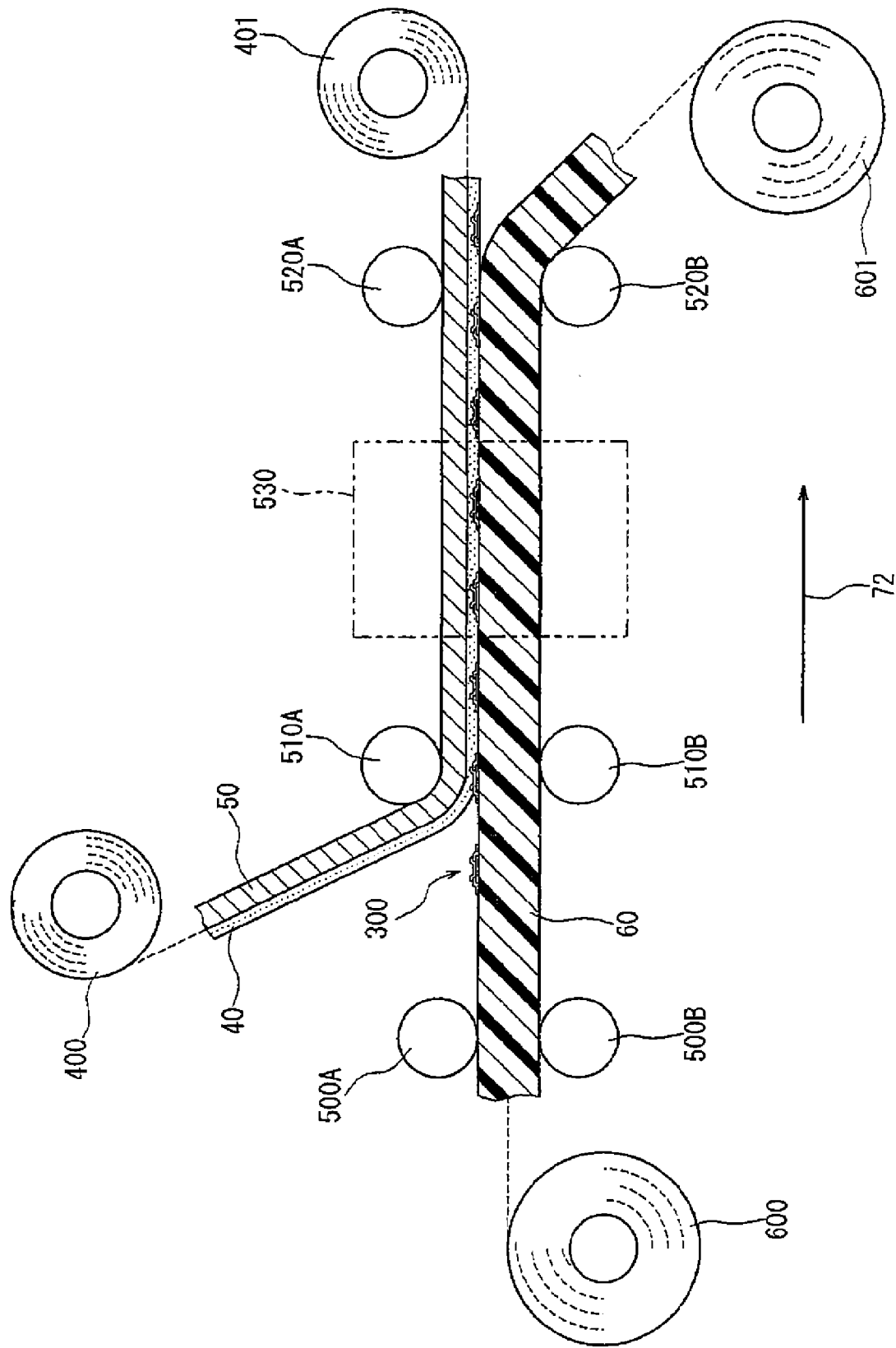
FIG. 6 schematically shows an operating embodiment of the flexible semiconductor device manufactured by the roll-to-roll process.

An example of a manufacturing process using the roll-to-roll process is shown in FIG. 6. In the embodiment of FIG. 6, the step wherein each layer 300 of TFT is transferred from the resin film 60 to the sealing resin layer 40 (which may correspond to each step shown in FIGS. 3A-D) is carried out by the roll-to-roll process.

First, a roll 600, which is formed by winding a resin film 60 into a roll, is prepared, in which each layer (the insulating film 10, the semiconductor layer 20, the extraction electrodes 30s and 30d) of TFT is formed on the upper surface of the resin film 60. Then, the resin film 60 is released from the roll 600 to the direction as shown by the arrow "72" by the rotation of convey rollers 500A and 500B, such that the resin film 60 is conveyed to the position above the press roller 510B. On the other hand, a roll 400, which is formed by winding a laminate formed by laminating the metal foil 50 onto the upper surface of the sealing resin layer 40, which was shaped into a film form, is prepared. Then, the laminate of the metal foil 50 and the sealing resin layer 40 is released from the roll 400 by the rotation of convey rollers, such that the laminate is conveyed to the position below the press roller 510A.

Next, each layer 300 of TFT formed on the upper surface of the resin film 60 is aligned to oppose the lower surface of the sealing resin layer 40, and the resin film 60 and the sealing resin layer 40 are pressed by both press rollers 510A and 510B, to thereby stack the lower surface of the sealing resin layer 40 on the upper surface of the resin film 60. By this pressurizing, each layer 300 of TFT on the resin film can be embedded into the lower surface of the sealing resin layer 40. When the sealing resin layer 40 in a film condition has not been hardened, the sealing resin layer 40 may be passed through a heating zone 530 (e.g. a drying oven) having a predetermined temperature to thereby be thermally hardened.

Subsequently, the resin film 60 and the sealing resin layer 40, in a laminated condition, are conveyed to the position between the press rollers 510A and 510B. When the resin film 60 is peeled from the lower surface of the sealing resin layer 40 with rotation of the rollers 520A and 520B, each layer 300 of TFT will be transferred to the lower surface of the sealing resin layer 40. Thus, each layer 300 of TFT can be transferred to the sealing resin layer 40. The sealing resin layer 40 after transfer is wound into the roll 401, and is passed to the following step, for example, to a cutting step. The resin film 60 after transfer is wound again into the roll 601, and can be reused in the following manufacturing process.

As described above, according to the roll-to-roll process, the devices which perform each of the steps are connected each other and the resin film 60 continuously flows among each of the devices, so that the time and effort accompanying conveyance can be substantially saved. In addition, automation of the production line can be easily attained and continuous production can also be attained.

Embodiment 2

Hereafter, another embodiment of the manufacturing method of the flexible semiconductor device in the present invention is illustrated. In the description below, the same reference number or symbol is given to the respective same member as in the flexible semiconductor device 100 in order to avoid duplication of the description.

In Embodiment 2 described below, instead of steps (ii) and (iii) in the above mentioned Embodiment 1, a step of (ii)' forming a semiconductor layer on the insulating film, and a step of (iii)' forming a pattern of extraction electrodes on the upper surface of the resin film so that the pattern of extraction electrodes contacts with the semiconductor layer are adopted.

Figure 7:
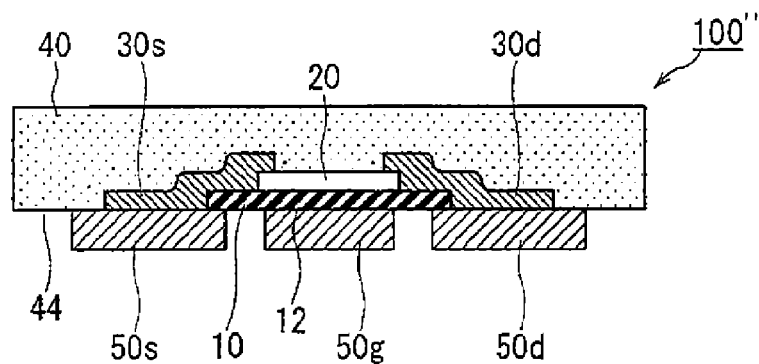
FIG. 7 schematically shows a sectional view illustrating a modified example of the flexible semiconductor device obtained from the manufacturing method of the present invention.

FIG. 7 shows another flexible semiconductor device 100", which is obtained from the manufacturing method of Embodiment 2. As illustrated, in the flexible semiconductor device 100", the gate electrode 50g is formed on the lower surface 12 of the insulating film 10, and is located coplanar with each of the source electrode 50s and the drain electrode 50d (i.e. on the lower surface 44 of the sealing resin layer 40). In this case, the insulating film 10 will function not only as a protection layer which protects the semiconductor layer 20, but also as a gate insulating film. The extraction electrodes 30s and 30d are formed on the semiconductor layer 20 as illustrated. Namely, in the flexible semiconductor device 100", the gate insulating film 10, the semiconductor layer 20, and the extraction electrodes 30s and 30d are stacked in this order from the bottom side thereof.

An example of the manufacturing process of the flexible semiconductor device 100" is illustrated with reference to FIGS. 8A-C and FIGS. 9A-D. Here, an explanation is omitted about the same elements and arrangement as in the process of the flexible semiconductor device 100 and 100' described above.

Figure 8A:
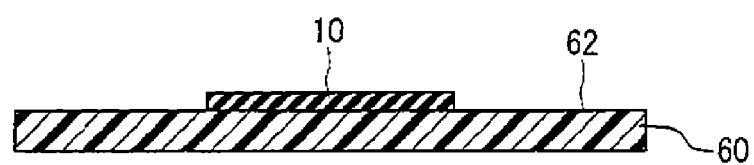
FIGS. 8A to 8C show a process sectional view (in Embodiment 2) which schematically show each step of manufacturing the flexible semiconductor device of the present invention.
Figure 8B:
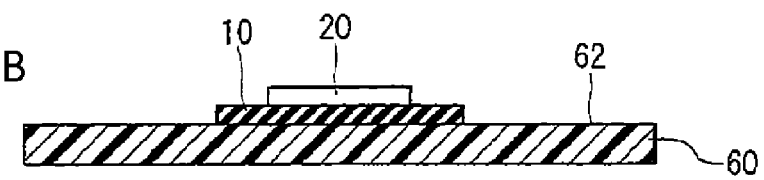

First, as shown in FIG. 8A, an insulating film 10 is formed on the upper surface 62 of a resin film 60. Then, as shown in FIG. 8B, a semiconductor layer 20 is formed on the insulating film 10. The method of forming each of the insulating film 10 and the semiconductor layer 20 is not particularly limited, so that the film 10 and the layer 20 may be formed in the same method as mentioned in Embodiment 1.

Figure 8C:
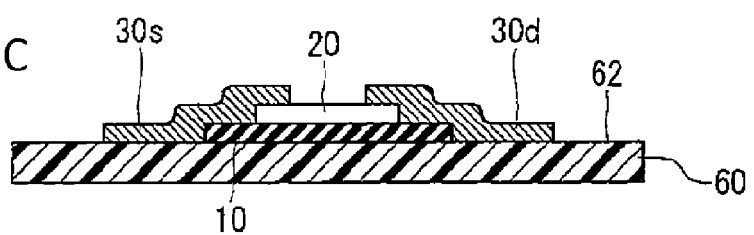

After the semiconductor layer 20 has been formed on the insulating film 10, the pattern of the source/drain extraction electrodes 30s and 30d are formed on the upper surface 62 of the resin film 60, so that the pattern of extraction electrodes contact with the semiconductor layer 20 as shown in FIG. 8C. In the embodiment as illustrated, the pattern of extraction electrodes 30s and 30d are formed so that the pattern of extraction electrodes cover a peripheral part of the semiconductor layer 20.

Figure 9A:
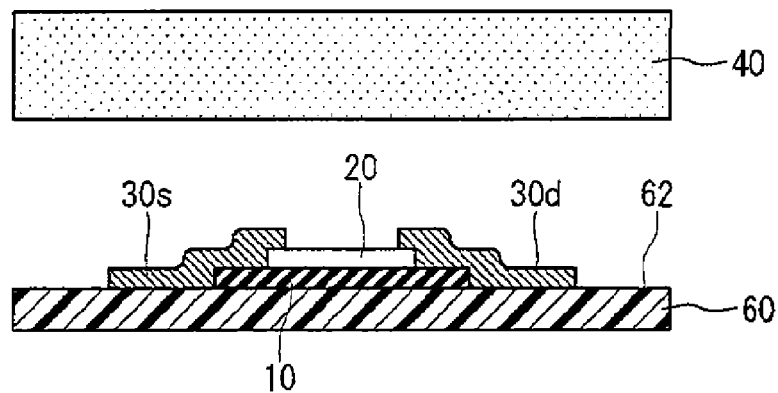
FIGS. 9A to 9D show a process sectional view (in Embodiment 2) which schematically show each step of manufacturing the flexible semiconductor device of the present invention.

Then, the sealing resin layer 40 is formed on the upper surface 62 of the resin film 60, so that the sealing resin layer 40 covers the semiconductor layer 20 and the pattern of extraction electrodes 30s and 30d as shown in FIG. 9A. The method of forming the sealing resin layer 40 is not particularly limited, so that the sealing resin layer 40 may be formed in the same method as mentioned in Embodiment 1. In the embodiment as illustrated, the sealing resin 40 is formed by pasting an unhardened resin, which is fabricated into a film beforehand, on the upper surface 62 of the resin film 60 and hardening the resin.

Figure 9B:
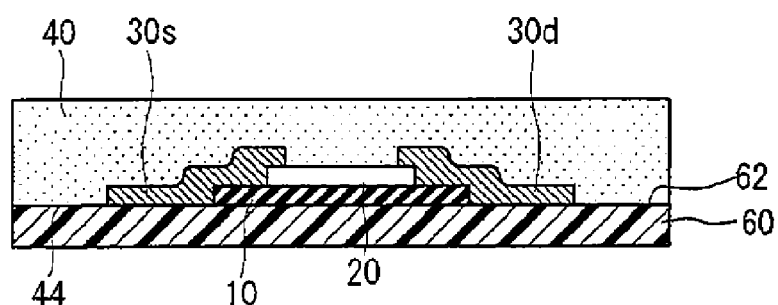

By passing through the above steps, the resin film 60, in which each layer (10, 20, 30s, 30d) of TFT is sealed by the sealing resin layer 40 on the upper surface 62 thereof can be obtained as shown in FIG. 9B.

Figure 9C:
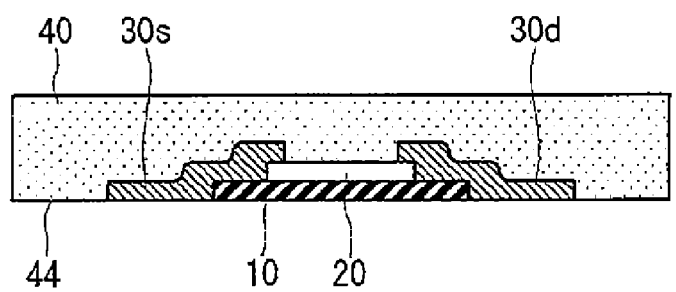

Thereafter, each layer of TFT, which was formed on the resin film 60, can be transferred to the sealing resin layer 40 by peeling the resin film 60 from the lower surface 44 of the sealing resin layer 40 as shown in FIG. 9C. In addition, the lower surface of the pattern of extraction electrodes 30s and 30d can be exposed from the sealing resin layer 40 by peeling the resin film 60.

Figure 9D:
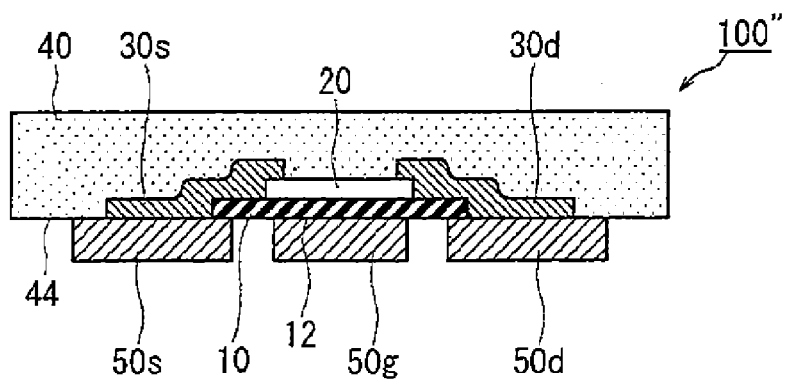

Then, as shown in FIG. 9D, each of the source electrode 50s and the drain electrode 50d is formed on each of the lower surfaces of the pattern of extraction electrodes 30s and 30d, each of which exposes from the sealing resin layer 40. Simultaneously, the gate electrode 50g is formed beneath the semiconductor layer 20 via the gate insulating film 10, that is, on the lower surface 12 of the gate insulating film 10. The method of forming each of the electrodes 50g, 50s and 50d is not particularly limited, so that each electrode may be formed in the same method as mentioned in Embodiment 1. Thus, a flexible semiconductor device 100″ as shown in FIG. 7 can be manufactured.

As described above, the present invention has been described with reference to several preferred embodiments. However, the present invention is not intended to be limited to those embodiments, but various changes, modifications and alterations can be made herein.

The present invention as illustrated above includes the embodiments as follows:

Embodiment 1: a method for manufacturing a flexible semiconductor device comprising the steps of:
(i) forming an insulating film on the upper surface of a resin film,
(ii) forming a pattern of extraction electrodes on the upper surface of the resin film,
(iii) forming a semiconductor layer on the insulating film so that the semiconductor layer contacts with the pattern of extraction electrodes, and
(iv) forming a sealing resin layer on the upper surface of the resin film so that the sealing resin layer covers the semiconductor layer and the pattern of extraction electrodes, wherein at least one forming step among the steps (i) to (iv) is carried out by a printing process.

Embodiment 2: the method for manufacturing the flexible semiconductor device according to the above embodiment 1, wherein all the forming steps (i) to (iv) are carried out by a printing process.

Embodiment 3: the method for manufacturing the flexible semiconductor device according to the above embodiment 1 or 2, wherein, after the step (iv), the lower surface of the pattern of extraction electrodes is exposed from the sealing resin layer by peeling the resin film.

Embodiment 4: the method for manufacturing the flexible semiconductor device according to the above embodiment 3, wherein the resin film which was peeled in a manufacturing process of a flexible semiconductor device is reused in a process of manufacturing another flexible semiconductor device when manufacturing a plurality of flexible semiconductor devices.

Embodiment 5: the method for manufacturing the flexible semiconductor device according to the above embodiment 4, wherein the reuse of the resin film is carried out by a roll-to-roll process.

Embodiment 6: the method for manufacturing the flexible semiconductor device according to the any one of the above embodiments 3 to 5, wherein each of the source electrode and drain electrode is formed on the lower surface of the pattern of extraction electrodes which are exposed from the sealing resin layer.

Embodiment 7: the method for manufacturing the flexible semiconductor device according to any one of the above embodiments 1 to 6, wherein a gate electrode is formed on the upper surface of the sealing resin layer.

Embodiment 8: the method for manufacturing the flexible semiconductor device according to the above embodiment 7, wherein formation process of the gate electrode comprises
a step of laminating the lower surface of the metal foil onto the upper surface of the sealing resin layer, and
a step of forming the gate electrode from the metal foil by etching the metal foil.

Embodiment 9: the method for manufacturing the flexible semiconductor device according to the above embodiment 8, wherein a metal foil having a surface roughness (Ra) of 300 nm or less at the lower surface thereof is used as the metal foil to be laminated onto the upper surface of the sealing resin layer.

Embodiment 10: the method for manufacturing the flexible semiconductor device according to any one of the above embodiments 1 to 9, which comprises, instead of steps (ii) and (iii), a step of (ii)′ forming a semiconductor layer on the insulating film, and a step of (iii)′ forming a pattern of extraction electrodes on the upper surface of the resin film so that the pattern of extraction electrodes contact with the semiconductor layer.

Embodiment 11: the method for manufacturing the flexible semiconductor device according to any one of the above embodiments 1 to 10, in which a gate electrode is formed on the lower surface of the insulating film.

As mentioned above, several embodiments of the present invention are described. However, a person skilled in the art will easily understand that the present invention is not limited to those embodiments, but various changes, modifications and alterations can be made herein.

Figure 5:
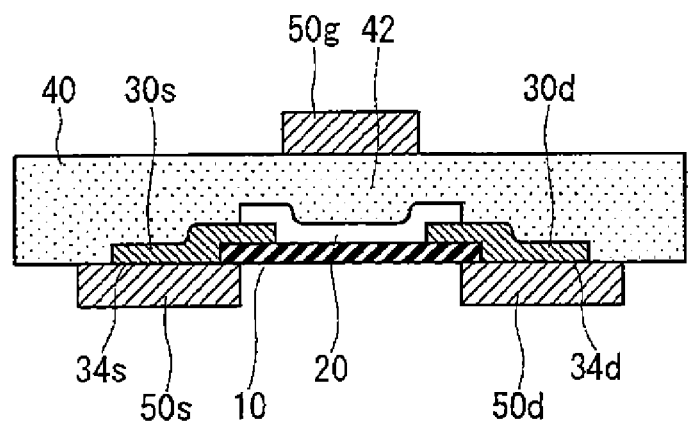
FIG. 5 is a sectional view showing a modified example of the flexible semiconductor device obtained from the manufacturing method of the present invention.
Figure 10:
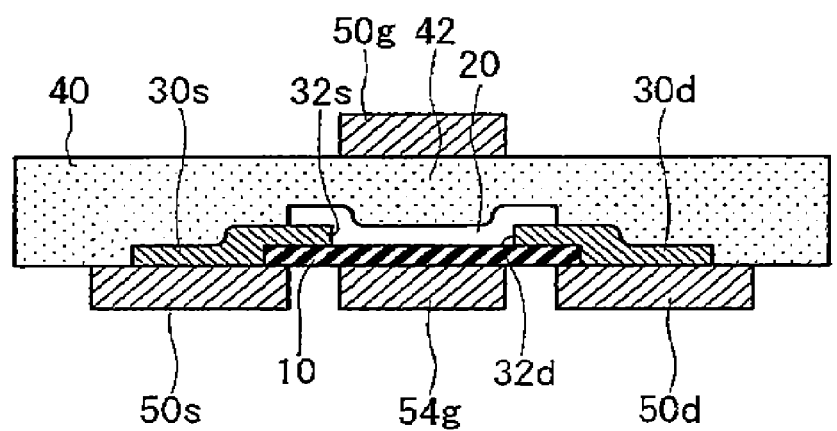
FIG. 10 shows a sectional view which illustrates a modified example of the flexible semiconductor device obtained from the manufacturing method of the present invention.

For example, as shown in FIG. 10, the present invention can be modified so that the flexible semiconductor device having a double-gate structure is manufactured. That is, in addition to the gate electrode 50g of the upper surface of the sealing resin, a further gate electrode 54g can be formed under the semiconductor layer 20 via the insulating film 10. The further gate electrode 54g can be formed in the same step of forming the source electrode 50s and the drain electrode 50d as shown in FIG. 5. In the embodiment where the flexible semiconductor device adopts such a double gate structure, it can allow a larger current to flow compared with the embodiment where the semiconductor device has one gate electrode. When an amount of current flowing through the device having the double gate structure is the same as that in the embodiment where the semiconductor device has single gate electrode, the amount of current flowing through each gate can be relatively reduced. As a result, the gate voltage can be reduced. In addition, it becomes possible to change the threshold voltage of the semiconductor device by independently using the two gate electrodes 50g and 54g, so that it can reduce the variation among the semiconductor device. It is further mentioned that there is a further advantage that various output size and frequency output can be obtained by using one gate electrode for the modulation.

Figure 11:
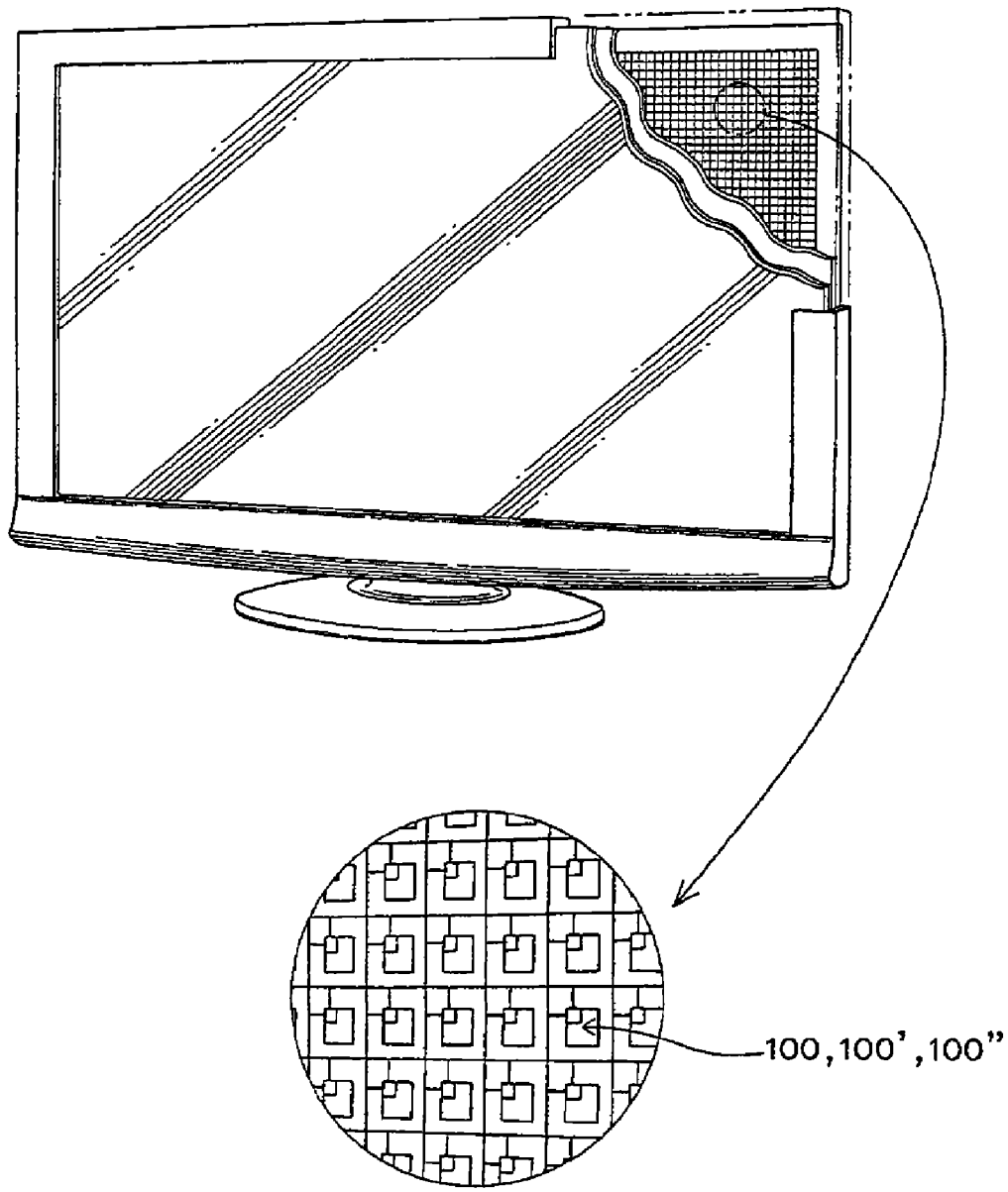
FIG. 11 shows an example of an application product of the flexible semiconductor device obtained from the manufacturing method of the present invention (an image display section of a television).
Figure 12:
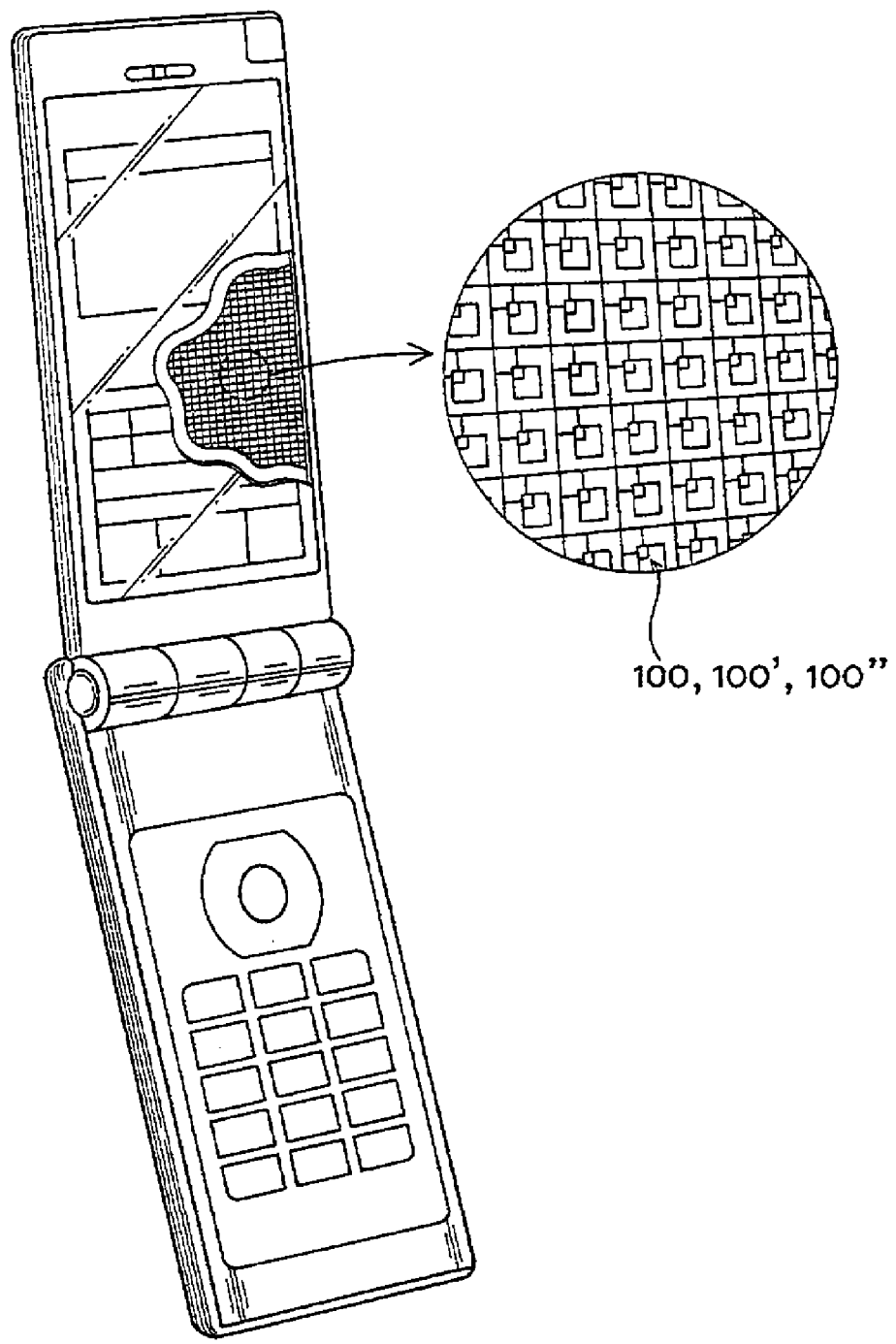
FIG. 12 shows an example of an application product of the flexible semiconductor device obtained from the manufacturing method of the present invention (an image display section of a cellular phone).
Figure 13:
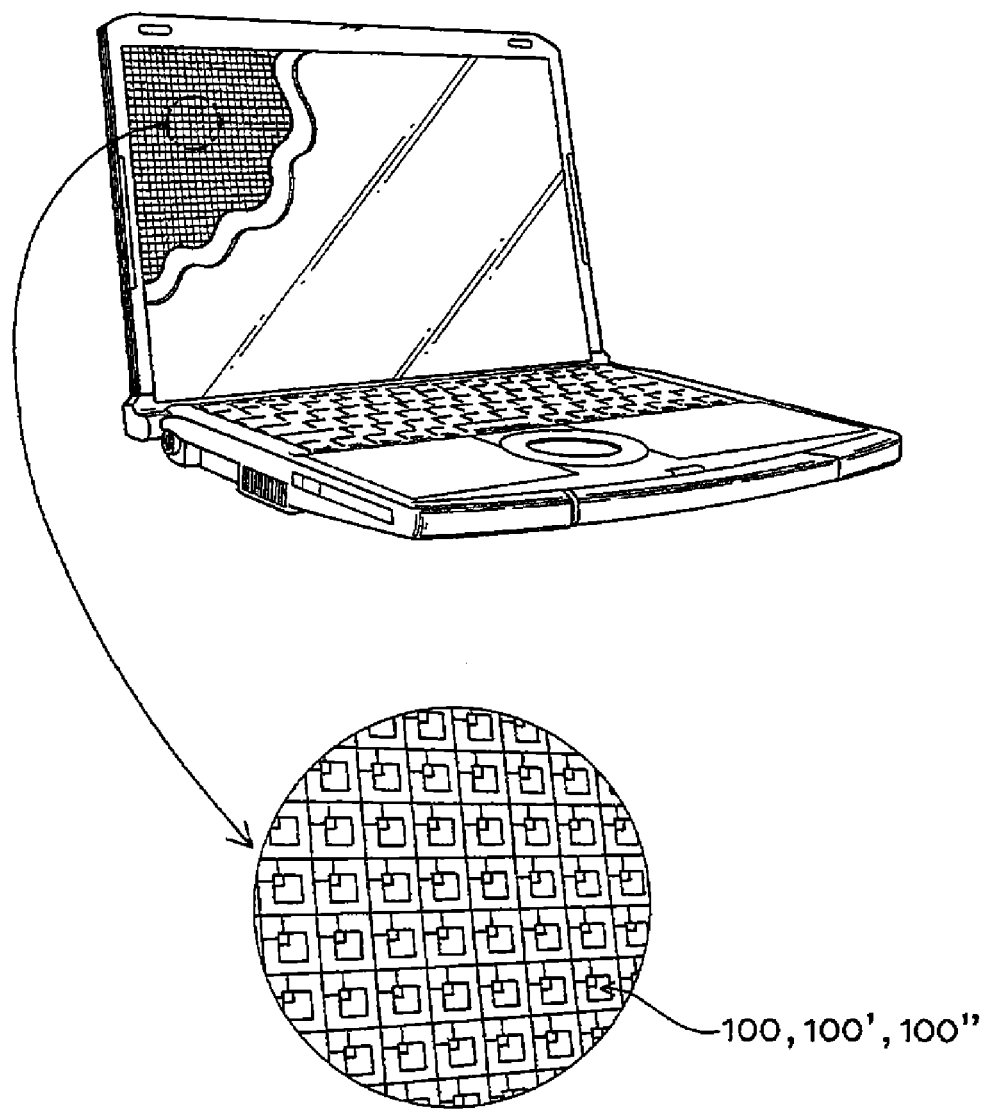
FIG. 13 shows an example of an application product of the flexible semiconductor device obtained from the manufacturing method of the present invention (an image display section of a mobile personal computer or a notebook computer).
Figure 14:
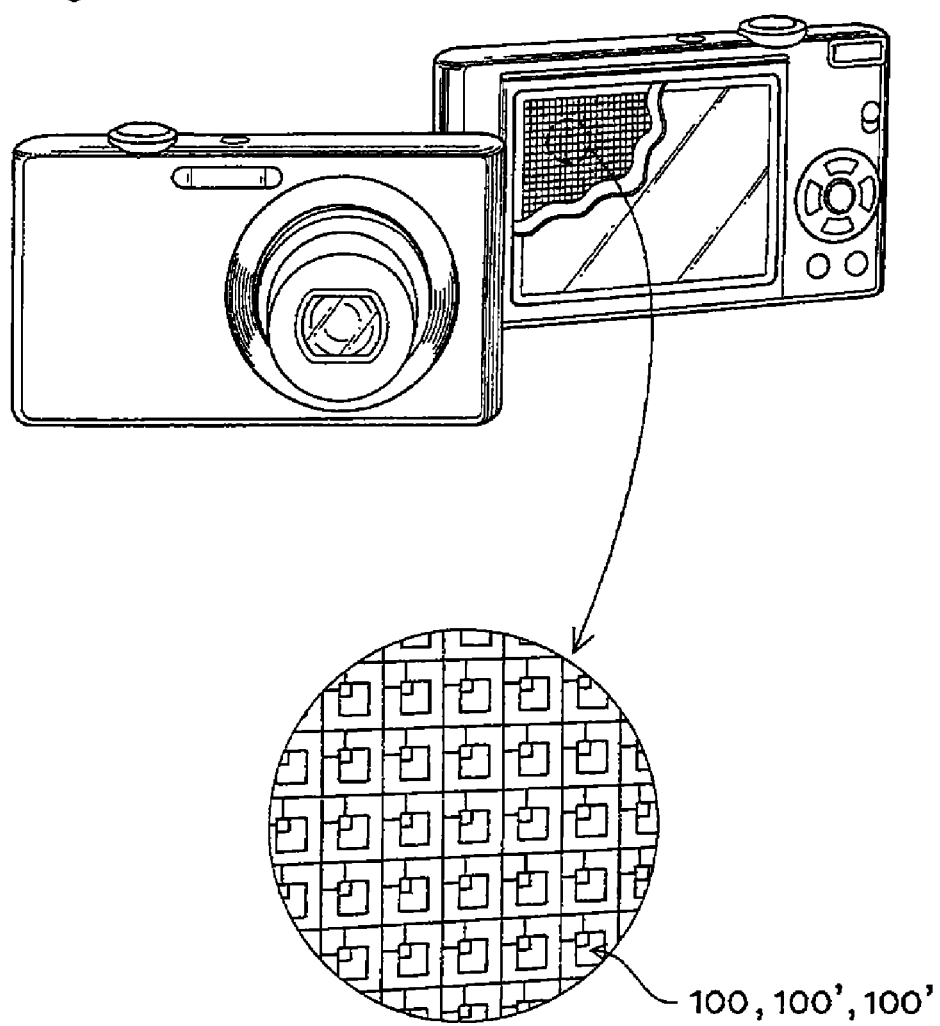
FIG. 14 shows an example of an application product of the flexible semiconductor device obtained from the manufacturing method of the present invention (an image display section of a digital still camera).
Figure 15:
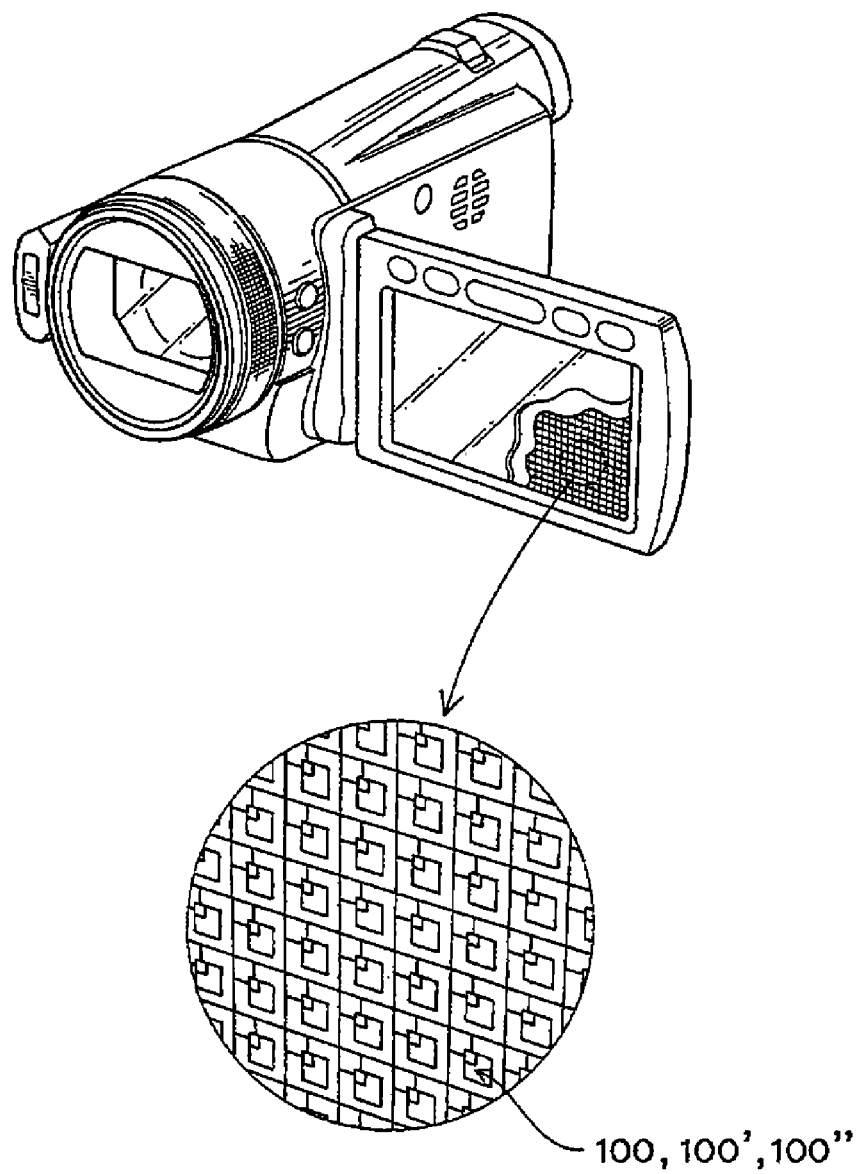
FIG. 15 shows an example of an application product of the flexible semiconductor device obtained from the manufacturing method of the present invention (an image display section of a camcorder).
Figure 16:
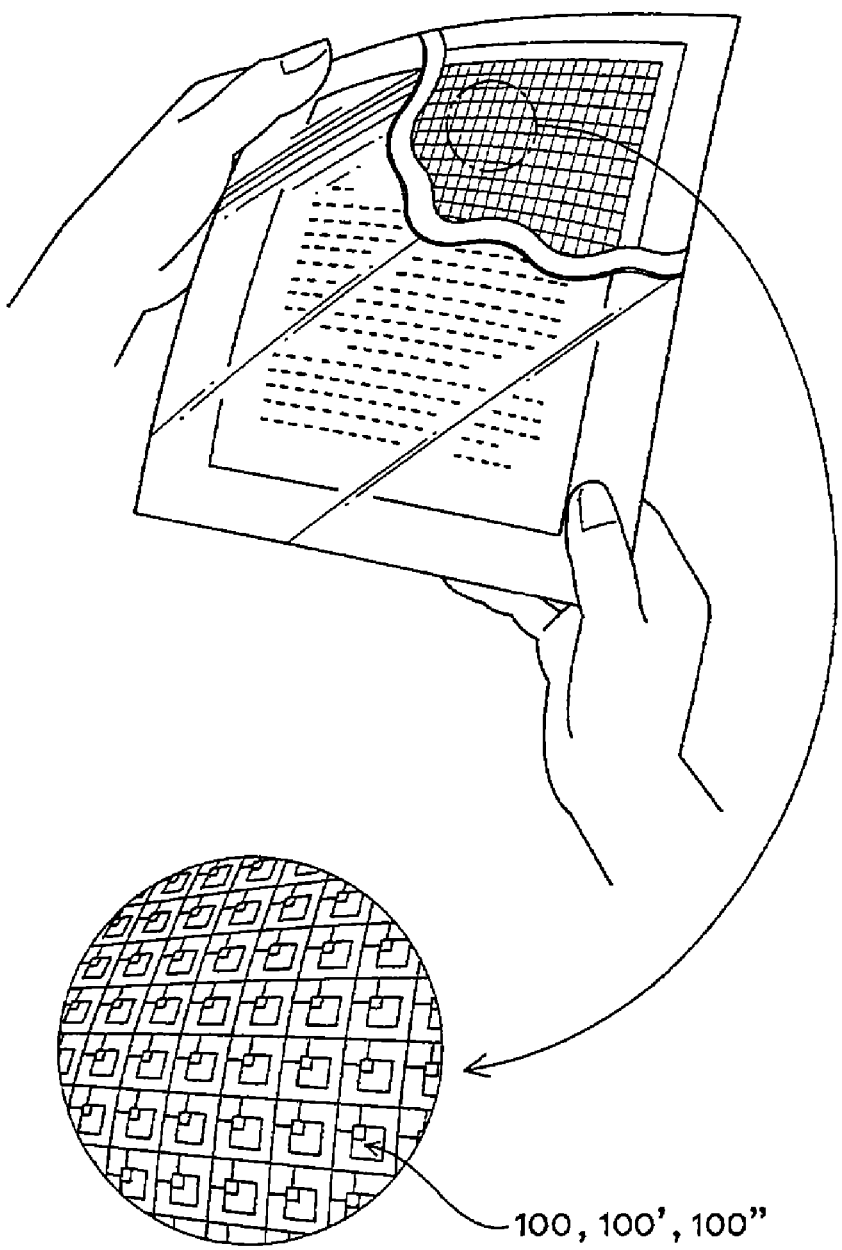
FIG. 16 shows an example of an application product of the flexible semiconductor device obtained from the manufacturing method of the present invention (an image display section of an electronic paper).
Figure 17:
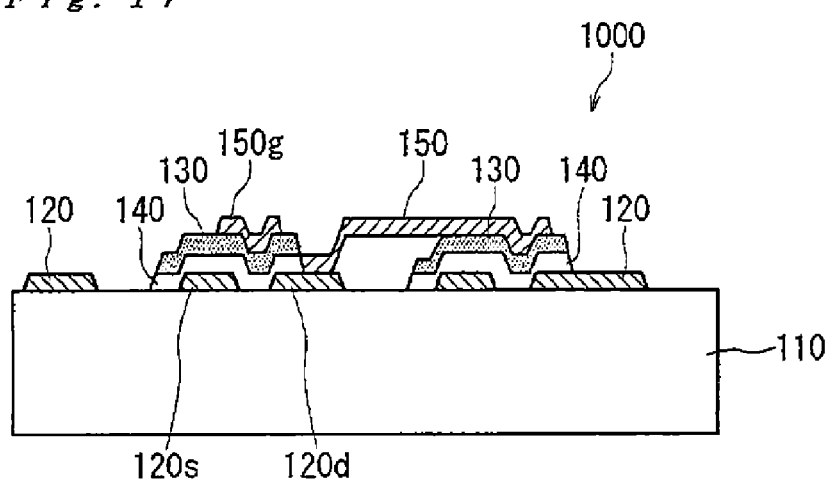
FIG. 17 shows a sectional view of the conventional flexible semiconductor device.

The method for manufacturing the flexible semiconductor device of the present invention is excellent in the productivity of a flexible semiconductor device. The obtained flexible semiconductor device can also be used for various image displays, and can also be used for electronic paper and digital paper and so forth. For example, the flexible semiconductor device can be used for the image display section of a television as shown in FIG. 11, the image display section of a cellular phone as shown in FIG. 12, the image display section of a mobile personal computer or a notebook computer as shown in FIG. 13, the image display section of a digital still camera and a camcorder as shown in FIGS. 14 and 15, and the image display section of an electronic paper as shown in FIG. 16 and so forth. The flexible semiconductor device obtained from the manufacturing method of the present invention can also be adapted for various applications, for example, an RF-ID, a memory, an MPU, a solar battery, a sensor and so forth, in which application of printed electronics technology is currently considered.

The invention claimed is:

1. A method for manufacturing a flexible semiconductor device, comprising:
   (i) performing a first printing process so as to form an insulating film on an upper surface of a resin film,
   (ii) after performing the first printing process, performing a second printing process so as to form a pattern of source and drain extraction electrodes on the upper surface of the resin film,
   (iii) after performing the second printing process, performing a third printing process so as to form a semiconductor layer on the insulating film so that the semiconductor layer contacts with the pattern of extraction electrodes,
   (iv) after performing the third printing process, performing a fourth printing process so as to form a sealing resin layer on the upper surface of the resin film so that the sealing resin layer covers the semiconductor layer and the pattern of extraction electrodes, and
   (v) placing a metal foil on the sealing resin layer by laminating a lower surface of the metal foil onto an upper surface of the sealing resin layer, and forming a gate electrode from the metal foil by etching the metal foil, the metal foil having a surface roughness (Ra) of 300 nm or less at the lower thereof.

2. The method for manufacturing the flexible semiconductor device according to claim 1, wherein, after performing said fourth printing process, the lower surface of the pattern of extraction electrodes is exposed from the sealing resin layer by peeling the resin film.

3. The method for manufacturing the flexible semiconductor device according to claim 2, wherein the resin film which was peeled in a manufacturing process of a flexible semiconductor device is reused in another manufacturing process of another flexible semiconductor device when manufacturing a plurality of flexible semiconductor devices.

4. The method for manufacturing the flexible semiconductor device according to claim 3, wherein the reuse of the resin film is carried out by a roll-to-roll process.

5. The method for manufacturing the flexible semiconductor device according to claim 2, further comprising forming a source electrode and a drain electrode on the lower surface of the pattern of extraction electrodes exposed from the sealing resin layer.

6. The method for manufacturing the flexible semiconductor device according to claim 2, further comprising forming a gate electrode on the lower surface of the insulating film.

7. A method for manufacturing a flexible semiconductor device, comprising:
   (i) performing a first printing process so as to form an insulating film on an upper surface of a resin film,
   (ii)' after performing the first printing process, performing a second printing process so as to form a semiconductor layer on the insulating film, and
   (iii)' after performing the second printing process, performing a third printing process so as to form a pattern of source and drain extraction electrodes on the upper surface of the resin film so that the pattern of extraction electrodes contact with the semiconductor layer,
   (iv) after performing the third printing process, performing a fourth printing process so as to form a sealing resin layer on the upper surface of the resin film so that the sealing resin layer covers the semiconductor layer and the pattern of extraction electrodes, and
   (v) placing a metal foil on the sealing resin layer by laminating a lower surface of the metal foil onto an upper surface of the sealing resin layer, and forming a gate electrode from the metal foil by etching the metal foil, the metal foil having a surface roughness (Ra) of 300 nm or less at the lower surface thereof.

8. The method for manufacturing the flexible semiconductor device according to claim 7, wherein, after performing said fourth printing process, the lower surface of the pattern of extraction electrodes is exposed from the sealing resin layer by peeling the resin film.

9. The method for manufacturing the flexible semiconductor device according to claim 8, wherein the resin film which was peeled in a manufacturing process of a flexible semiconductor device is reused in another manufacturing process of another flexible semiconductor device when manufacturing a plurality of flexible semiconductor devices.

10. The method for manufacturing the flexible semiconductor device according to claim 9, wherein the reuse of the resin film is carried out by a roll-to-roll process.

11. The method for manufacturing the flexible semiconductor device according to claim 8, further comprising forming a source electrode and a drain electrode on the lower surface of the pattern of extraction electrodes exposed from the sealing resin layer.

12. The method for manufacturing the flexible semiconductor device according to claim 8, further comprising forming a gate electrode on the lower surface of the insulating film.

* * * * *